(12) United States Patent  (10) Patent No.: US 8,546,854 B2
Kim  (45) Date of Patent: Oct. 1, 2013

(54) SEMICONDUCTOR DEVICE AND METHOD FOR MANUFACTURING THE SAME

(75) Inventor: Jong Su Kim, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 214 days.

(21) Appl. No.: 12/771,801

(22) Filed: Apr. 30, 2010

(65) Prior Publication Data

US 2011/0266597 A1   Nov. 3, 2011

(51) Int. Cl.
  *H01L 29/78*  (2006.01)
  *H01L 21/336* (2006.01)

(52) U.S. Cl.
  USPC .... 257/288; 257/411; 257/392; 257/E21.409; 257/E29.255; 438/294; 438/176; 438/585; 438/199; 438/18

(58) Field of Classification Search
  USPC .............. 257/288, E21.409, E29.255, 88, 257/392, 402, 407; 438/294, 199, 10, 18
  See application file for complete search history.

(56) References Cited

U.S. PATENT DOCUMENTS

| 6,346,427 B1 * | 2/2002 | Gardner et al. ............. 438/10 |
| 2008/0044989 A1 * | 2/2008 | Oh et al. ................... 438/585 |
| 2008/0079040 A1 * | 4/2008 | Nam .......................... 257/288 |

FOREIGN PATENT DOCUMENTS

| KR | 100608374 B1 | 7/2006 |
| KR | 1020070016860 A | 2/2007 |
| KR | 10-2007-0088062 A | 8/2007 |
| KR | 1020070078567 A | 8/2007 |

* cited by examiner

*Primary Examiner* — Cathy N Lam
(74) *Attorney, Agent, or Firm* — William Park & Associates Patent Ltd.

(57) ABSTRACT

A semiconductor device includes an isolation layer formed on a semiconductor substrate; an active region defined by the isolation layer; at least one gate line formed to overlap with the active region; at least one first active tab formed on a first interface of the active region which overlaps with the gate line; and a first gate tab formed on a second interface facing away from the first interface in such a way as to project from the gate line.

4 Claims, 4 Drawing Sheets

SEMICONDUCTOR DEVICE AND METHOD FOR MANUFACTURING THE SAME

BACKGROUND

1. Technical Field

The present invention relates to a semiconductor device and a method for manufacturing the same, and more particularly, to a semiconductor device and a method for manufacturing the same which can suppress an HEIP (hot electron-induced punch-through) phenomenon in a highly integrated semiconductor device.

2. Related Art

As a semiconductor device is highly integrated, a channel length gradually decreases, and the threshold voltage of a transistor is gradually reduced.

Due to such narrow effects, an HEIP (hot electron-induced punch-through) phenomenon occurs, specifically, in a word line formed in the peripheral circuit region of a semiconductor integrated circuit. That is to say, additional electrons are produced in a portion where an active region and a word line overlap with each other, and as these electrons are trapped on an interface between the active region overlapping with the word line and an isolation layer, leakage current is generated along the interface of the active region.

The HEIP phenomenon causes a result that the channel length further decreases and the threshold voltage is further reduced. In a worse case, unwanted turn-on of a transistor may be caused.

Therefore, as off-leakage current increases in a standby state, problems are caused in that not only power consumption increases, but also an operating speed may decrease or a malfunction may result.

In order to solve these problems, while an attempt has been made in which doping concentrations of source and drain areas are increased in an effort to suppress the HEIP phenomenon, difficulties still exist in completely suppressing the HEIP phenomenon.

SUMMARY

In one embodiment of the present invention, a semiconductor device comprises an isolation layer formed on a semiconductor substrate; an active region defined by the isolation layer; at least one gate line formed to overlap with the active region; at least one first active tab formed on a first interface of the active region which overlaps with the gate line; and a first gate tab formed on a second interface facing away from the first interface in such a way as to project from the gate line.

In another embodiment of the present invention, a semiconductor device comprises an isolation layer formed on a semiconductor substrate; an active region defined by the isolation layer; at least one gate line formed to overlap with the active region; active tabs formed on respective interfaces of the active region which overlap with the gate line; and gate tabs formed to project from the gate line and to overlap with the active tabs.

In another embodiment of the present invention, a method for manufacturing a semiconductor device comprises the steps of forming an isolation layer on a semiconductor substrate and thereby defining an active region which has a first active tab on a first interface; and forming a gate line across the active region to cover the first active tab, wherein, when forming the gate line, a first gate tab which projects from the gate line is formed on a second interface of the active region which faces away from the first interface.

In another embodiment of the present invention, a method for manufacturing a semiconductor device comprises the steps of forming an isolation layer on a semiconductor substrate and thereby defining an active region which has a first active tab on a first interface and a second active tab on a second interface which faces away from the first interface; and forming a gate line across the active region to cover the first active tab and the second active tab, wherein, when forming the gate line, gate tabs which project from the gate line are formed in such a way as to overlap with the first and second active tabs, respectively.

BRIEF DESCRIPTION OF THE DRAWINGS

Features, aspects, and embodiments are described in conjunction with the attached drawings, in which.

DETAILED DESCRIPTION

Hereinafter, a semiconductor device and a method for manufacturing the same according to the present invention will be described below with reference to the accompanying drawings through preferred embodiments.

Figure 1:
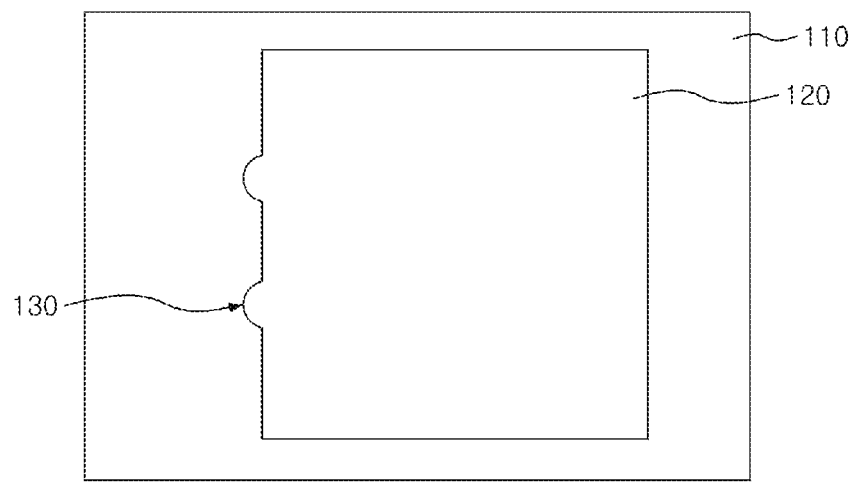
FIGS. 1 through 3 are layout views explaining a method for manufacturing a semiconductor device in accordance with an embodiment of the present invention.
Figure 2:
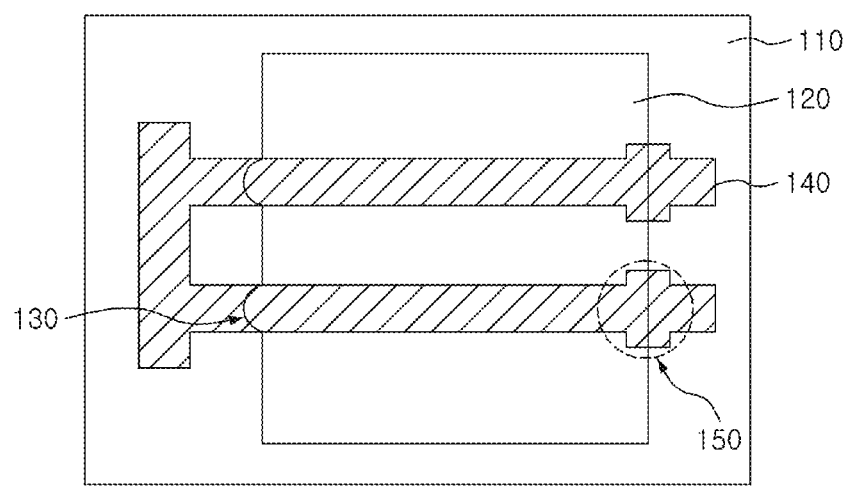
Figure 3:
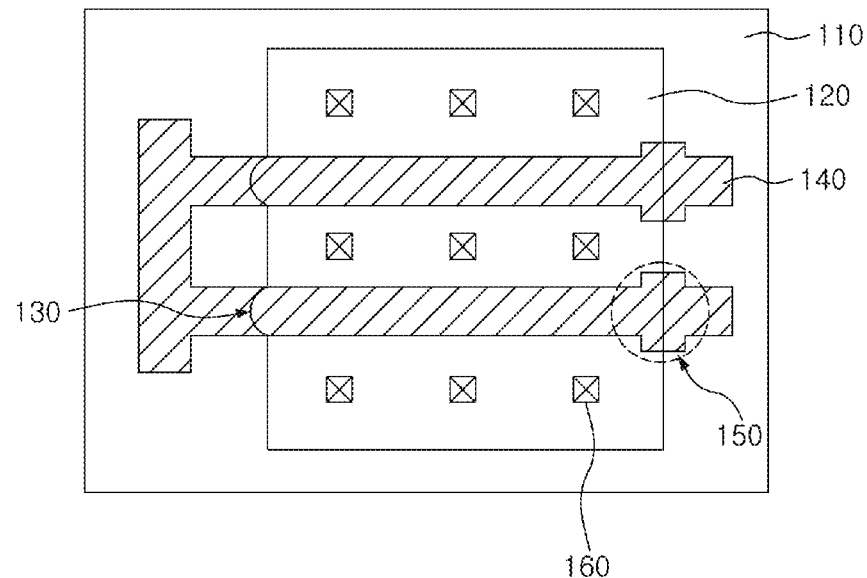

FIGS. 1 through 3 are layout views explaining a method for manufacturing a semiconductor device in accordance with an embodiment of the present invention.

First, as shown in FIG. 1, an isolation layer 110 is formed on a semiconductor substrate, and an active region 120 is defined thereby.

The active region 120 includes one or more active tabs 130 which are formed on any one of interfaces between the active region 120 and the isolation layer 110.

By forming and patterning a gate insulation layer and a gate conductive layer on the resultant structure, one or more gate lines 140 are formed as shown in FIG. 2. The gate lines 140 are formed in a manner such that each gate line 140 covers each active tab 130 while extending across the active region 120. Each gate line 140 has a gate tab 150. The gate tabs 150 are formed on the second interface facing away from the first interface on which the active tabs 130 are formed.

Then, source and drain regions (not shown) are formed through an ion implantation process, and as shown in FIG. 3, bit line contact holes 160 are defined.

In the embodiment, the active tab 130s are formed on one interface between the active region 120 and the isolation layer 110, and the gate tabs 150 are formed on portions of the gate lines 140 which overlap with another interface between the active region 120 and the isolation layer 110, facing away from the active tabs 130.

Due to this fact, an effective channel length may be sufficiently secured, and the HEIP phenomenon may be effectively prevented.

Figure 4:
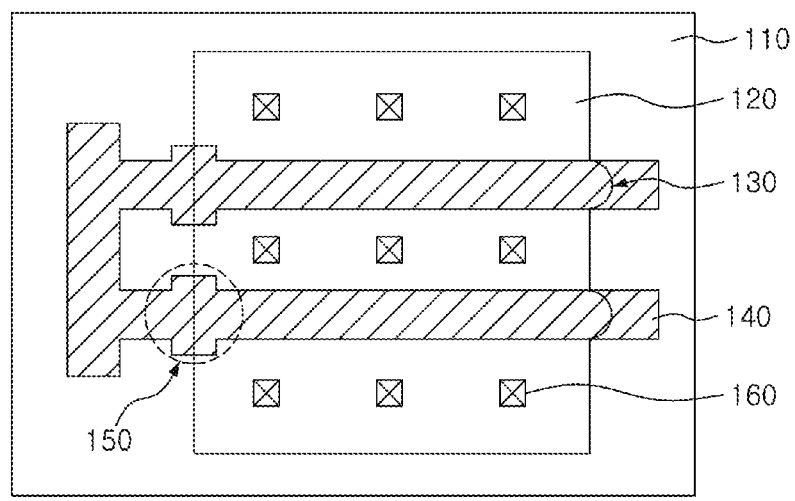
FIG. 4 is a layout view explaining a method for manufacturing a semiconductor device in accordance with another embodiment of the present invention.

FIG. 4 is a layout view explaining a method for manufacturing a semiconductor device in accordance with another embodiment of the present invention.

When comparing a semiconductor device according to the present embodiment with the semiconductor device shown in FIGS. 1 through 3, the positions of active tabs 130 and gate tabs 150 are reversed.

That is to say, while the active tabs 130 are formed on the first interface between the active region 120 and the isolation layer 110 in FIG. 3, the semiconductor device shown in FIG. 4 has one or more active tabs 130 which are formed on the second interface facing away from the first interface.

The gate tabs 150 are formed on portions of gate lines 140 which overlap with the first interface between the active region 120 and the isolation layer 110, facing away from the active tabs 130. Therefore, it can be appreciated from FIG. 4 that the gate tabs 150 are formed on the first interface.

Thus, due to the fact that the active tabs 130 are formed on the first interface or the second interface between the active region 120 and the isolation layer 110 and the gate tabs 150 are formed on the portions of the gate lines 140 which overlap with the opposite interface, that is, the second interface or the first interface between the active region 120 and the isolation layer 110, an effective channel length may be increased.

Accordingly, since the narrow effects and the HEIP phenomenon resulting therefrom may be suppressed, power consumption of the semiconductor device can be minimized.

While, in the semiconductor devices shown in FIGS. 3 and 4, the active tabs 130 are formed on one interface between the active region 120 and the isolation layer 110 and the gate tabs 150 are formed on the opposite interface, the present invention is not limited only to such formation of the tabs.

That is to say, it can be envisaged that gate tabs (not shown), which project from the gate lines 140 overlapping with the interface having the active tabs 130 formed thereon, may be formed in such a way as to overlap with the active tabs 130.

Figure 5:
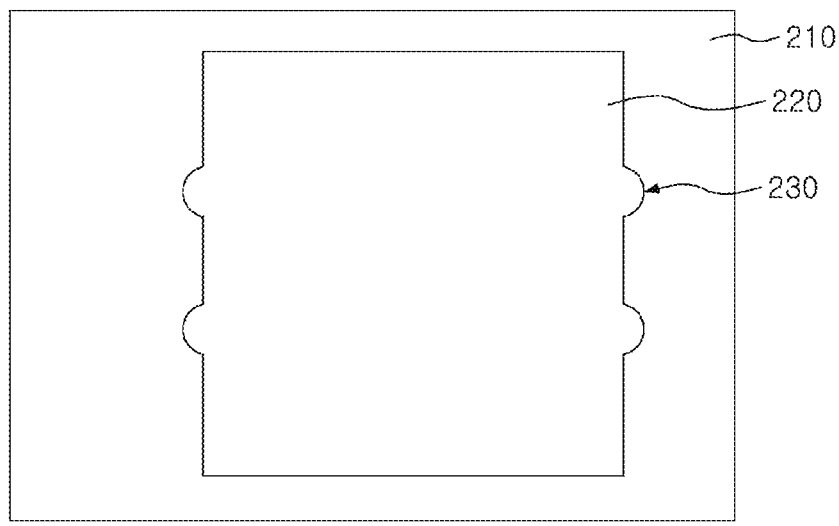
FIGS. 5 through 7 are layout views explaining a method for manufacturing a semiconductor device in accordance with another embodiment of the present invention.
Figure 6:
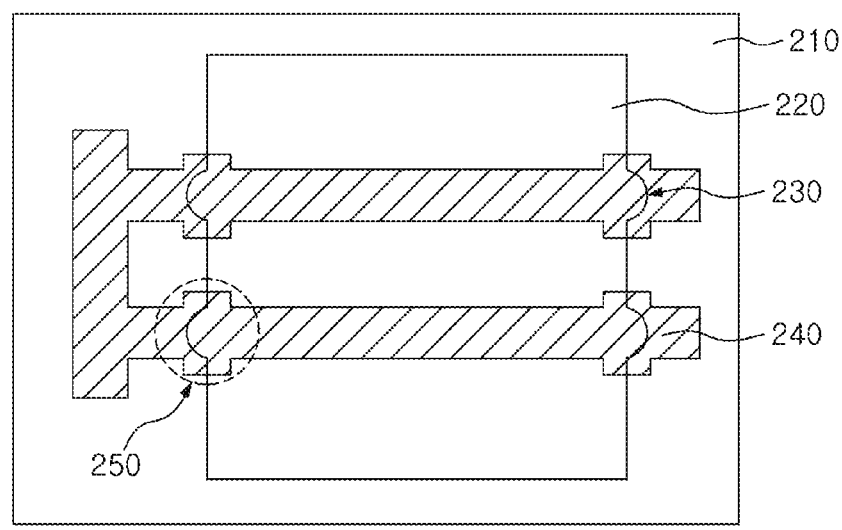
Figure 7:
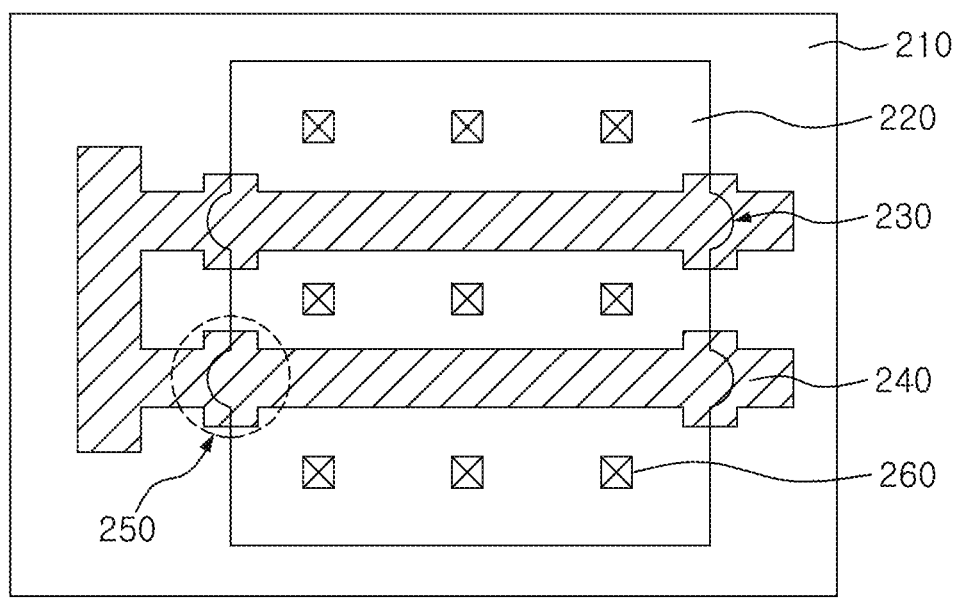

FIGS. 5 through 7 are layout views explaining a method for manufacturing a semiconductor device in accordance with another embodiment of the present invention.

A semiconductor device according to the present embodiment has active tabs and gate tabs which are formed to overlap with each other.

In detail, as shown in FIG. 5, an isolation layer 210 is formed on a semiconductor substrate, and an active region 220 is defined thereby. The active region 220 has a plurality of active tabs 230 which are formed on the first interface of the active region 220 and on the second interface of the active region 220, facing away from the first interface. The active tabs 230 are formed at positions where gate lines to be subsequently formed overlap with the active tabs 230.

Next, by forming and patterning a gate insulation layer and a gate conductive layer on the resultant structure, gate lines 240 are formed as shown in FIG. 6. The gate lines 240 are patterned in a manner such that each gate line 240 is formed to cover each active tab 230 while extending across the active region 220. Gate tabs 250 are formed where the gate lines 240 overlap with the interfaces of the active region 230 in a manner such that the active tabs 230 and the gate tabs 250 can overlap with each other.

Then, source and drain regions (not shown) are formed, and as shown in FIG. 7, bit line contact holes 260 are defined.

In the present embodiment, due to the fact that the active tabs 230 and the gate tabs 250 are formed to overlap with each other, when compared to the case in which the active tabs and the gate tabs are independently formed on respective interfaces, it is possible to form the tabs to have a decreased size.

Accordingly, the semiconductor device can be highly integrated, an effective channel length can be sufficiently secured, and the operation reliability of the semiconductor device can be ensured.

The semiconductor devices described above with reference to FIGS. 1 through 7 may comprise a PMOS transistor, in particular, a PMOS transistor which is formed in the peripheral region of a semiconductor integrated circuit.

While certain embodiments have been described above, it will be understood to those skilled in the art that the embodiments described are by way of example only. Accordingly, the device and method described herein should not be limited based on the described embodiments. Rather, the device and method described herein should only be limited in light of the claims that follow when taken in conjunction with the above description and accompanying drawings.

What is claimed is:

1. A semiconductor device comprising:
   an isolation layer formed on a semiconductor substrate;
   an active region defined by the isolation layer;
   a plurality of gate lines formed across the active region in a first direction, and to overlap with the active region;
   at least one first active tab formed on a first interface of the active region which overlaps with the gate lines; and
   a first gate tab formed on a second interface facing away from the first interface in such a way as to project from the gate line,
   wherein the at least one first active tab is extended into the isolation layer in a the first direction by predetermined length, and
   wherein the plurality of gate lines completely cover an extended area of the at least one first active tab, and
   wherein the first gate tab is extended in a second direction perpendicular to the first direction by predetermined length.

2. The semiconductor device according to claim 1, wherein the semiconductor device comprises a PMOS transistor.

3. The semiconductor device according to claim 1, further comprising:
   a second gate tab formed to project from the gate line and to overlap with the first active tab.

4. The semiconductor device according to claim 1, further comprising:
   at least one second active tab formed on the second interface of the active region,
   wherein the first gate tab overlaps with the second active tab.

* * * * *